(12) United States Patent
Kilian et al.

(10) Patent No.: US 9,441,299 B2
(45) Date of Patent: Sep. 13, 2016

(54) METHOD FOR ACTIVATING A COPPER SURFACE FOR ELECTROLESS PLATING

(71) Applicant: Atotech Deutschland GmbH, Berlin (DE)

(72) Inventors: Arnd Kilian, Berlin (DE); Jens Wegricht, Berlin (DE); Donny Lautan, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 0 days.

(21) Appl. No.: 14/779,983

(22) PCT Filed: Jan. 7, 2014

(86) PCT No.: PCT/EP2014/050158
§ 371 (c)(1),
(2) Date: Sep. 25, 2015

(87) PCT Pub. No.: WO2014/154365
PCT Pub. Date: Oct. 2, 2014

(65) Prior Publication Data
US 2016/0040295 A1    Feb. 11, 2016

(30) Foreign Application Priority Data
Mar. 25, 2013   (EP) .................................. 13160785

(51) Int. Cl.
| | | |
|---|---|---|
| *B05D 3/10* | (2006.01) | |
| *C23C 18/18* | (2006.01) | |
| *H01L 21/288* | (2006.01) | |
| *H05K 1/09* | (2006.01) | |
| *H05K 3/18* | (2006.01) | |
| C23C 18/36 | (2006.01) | |
| C23C 18/44 | (2006.01) | |
| H05K 3/24 | (2006.01) | |
| H01L 21/768 | (2006.01) | |

(52) U.S. Cl.
CPC ....... *C23C 18/1831* (2013.01); *C23C 18/1841* (2013.01); *C23C 18/1844* (2013.01); *H01L 21/288* (2013.01); *H05K 1/09* (2013.01); *H05K 3/182* (2013.01); C23C 18/36 (2013.01); C23C 18/44 (2013.01); H01L 21/76849 (2013.01); H05K 3/24 (2013.01)

(58) Field of Classification Search
CPC .......... C23C 18/1831; C23C 18/1841; C23C 18/1844; C23C 18/36; C23C 18/44
USPC ........... 427/97.9, 99.5, 304, 305, 437, 443.1
See application file for complete search history.

(56) References Cited

U.S. PATENT DOCUMENTS 4,066,517 A    1/1978   Stevens et al.
7,285,492 B2  10/2007   Wang et al.

FOREIGN PATENT DOCUMENTS

| JP | 2007177268 | | 7/2007 |
| JP | 2008184679 | | 8/2008 |
| JP | 2008184679 | A * | 8/2008 |

OTHER PUBLICATIONS

PCT/EP2014/050158; PCT International Preliminary Report on Patentability mailed Oct. 8, 2015.
PCT/EP2014/050158; PCT International Search Report and Written Opinion of the International Searching Authority dated Apr. 22, 2014.

* cited by examiner

*Primary Examiner* — Dah-Wei D Yuan
*Assistant Examiner* — Nga Leung V Law
(74) *Attorney, Agent, or Firm* — Renner, Otto, Boisselle & Sklar, LLP

(57) ABSTRACT

The present invention relates to method for activating a copper or copper alloy surface for depositing a metal or metal alloy layer by electroless (autocatalytic) plating thereon wherein the formation of undesired voids is suppressed. The copper or copper alloy surface is contacted with palladium ions, at least one phosphonate compound and halide ions followed by electroless (autocatalytic) deposition of a metal such as palladium or a metal alloy such as a Ni—P alloy.

20 Claims, No Drawings

METHOD FOR ACTIVATING A COPPER SURFACE FOR ELECTROLESS PLATING

FIELD OF THE INVENTION

The present invention relates to a method for activating a copper or copper alloy surface for successive electroless (autocatalytic) plating of a metal or metal alloy thereon. This method is particularly useful in the manufacture of printed circuit boards and IC substrates as well as in semiconductor metallization processes.

BACKGROUND OF THE INVENTION

Selective deposition of various metals and metal alloys onto features made of copper or a copper alloy by electroless (autocatalytic) plating is a common method in the manufacture of printed circuit boards and IC substrates as well as in metallization of semiconductor devices in e.g. microchip manufacture. Palladium is an example of a metal to be deposited onto such copper or copper alloy features. Examples of metal alloys for this purpose are nickel alloys such as Ni—P alloys and cobalt alloys such as Co—Mo—P and Co—W—P alloys.

A copper or copper alloy surface requires an activation prior to the electroless (autocatalytic) deposition of a metal or metal alloy thereon. The most prominent means for activating a copper or copper alloy surface is the deposition of a palladium seed layer by immersion-type plating of palladium which is a redox reaction wherein copper is oxidized and palladium ions present in the activation solution are reduced to metallic state. Such a seed layer of palladium then serves as the plating base for depositing a metal or metal alloy layer onto the copper or copper alloy feature by electroless (autocatalytic) plating. The activation solutions utilized are usually acidic.

A method for activating a copper or copper alloy surface for successive electroless deposition of a metal or metal alloy thereon is disclosed in U.S. Pat. No. 7,285,492 B2. The substrate is first contacted with a cleaning solution comprising an aqueous solution of a carboxyl group-containing organic acid or its salt and a surfactant. Next, the cleaned substrate is contacted with a processing solution comprising palladium ions and a carboxyl group-containing organic acid or a salt thereof. A metal or metal alloy layer can then be deposited onto the activated substrate by electroless (autocatalytic) plating.

The immersion-type plating of palladium from an acidic solution causes the formation of undesired voids in the surface area of the copper or copper alloy feature activated. Such voids, for example, reduce the reliability of solder joints or wire bonds in case the copper or copper alloy feature is a contact pad used for soldering or wire bonding.

OBJECTIVE OF THE PRESENT INVENTION

It is the objective of the present invention to supress formation of undesired voids when activating a copper or copper alloy surface with an acidic activator solution comprising palladium ions for successive electroless (autocatalytic) plating.

SUMMARY OF THE INVENTION

This objective is solved by a method for activating a copper or copper alloy surface for depositing a metal or metal alloy layer by electroless (autocatalytic) plating thereon comprising, in this order, the steps of
i. providing a substrate comprising a copper or copper alloy surface,
ii. contacting said substrate with the following components
   a. an aqueous solution containing a source of palladium ions,
   b. an aqueous solution containing a phosphonate compound
   c. an aqueous solution containing a source of halide ions and
iii. depositing a metal or metal alloy layer onto the activated copper or copper alloy surface obtained in step ii. by electroless plating
   wherein no organic acid or salt thereof comprising a carboxylic group without phosphonate group is used in step ii.

Formation of undesired voids in the copper or copper alloy surface area is successfully suppressed by the method according to the present invention.

DETAILED DESCRIPTION OF THE INVENTION

Copper and copper alloy surfaces to be activated by the method according to the present invention are for example contact areas of a printed circuit board, an IC substrate or on a semiconducting substrate such as a silicon wafer.

In a first embodiment of the present invention the substrate comprising a copper or copper alloy surface is contacted with an aqueous solution comprising a source of palladium ions, at least one phosphonate compound and halide ions wherein said solution is free of any carboxyl group-containing organic acid or salt thereof with exception of carboxylic group-containing phosphonate compounds such as 2-phosphonobutane-1,2,4-tricarboxylate.

The method according to the first embodiment comprises, in this order, the steps of
i. providing a substrate comprising a copper or copper alloy surface,
ii. contacting said substrate with an aqueous solution comprising a source of palladium ions, at least one phosphonate compound and halide ions and
iii. depositing a metal or metal alloy layer onto the activated copper or copper alloy surface obtained in step ii. by electroless plating
   wherein no organic acid or salt thereof comprising a carboxylic group without phosphonate group is used in step ii.

The halide ions in the aqueous solution of the first embodiment of the present invention are preferably selected from the group consisting of chloride, bromide and iodide. Most preferably, the halide ions in the aqueous solution of the first embodiment are chloride ions. The source of halide ions is preferably selected from the corresponding acid or alkaline metal or ammonium salt such as HCl, NaCl, KCl and $NH_4Cl$. The concentration of halide ions in the aqueous solution of the first embodiment preferably ranges from 0.1 to 100 mg/l, more preferably from 0.5 to 50 mg/l, most preferably from 5 to 30 mg/l.

If the halide ion concentration is too high, it has been found that the activation is weak and that the activation step may fail to start the subsequent autocatalytic reaction for electroless (autocatalytic) plating.

In a second embodiment of the present invention, the substrate comprising a copper or copper alloy surface is contacted with a first aqueous solution comprising a source of palladium ions and at least one phosphonate compound wherein said first aqueous solution is free of any carboxyl group-containing organic acid or salt thereof without phosphonate group and also free of halide ions.

The first aqueous solution of the second embodiment is the same solution applied in step ii. of the first embodiment except that it is free of halide ions.

Thereafter, said substrate is contacted with a second aqueous solution comprising halide ions.

Palladium ions may be displaced from the first aqueous solution to the second aqueous solution during use, especially if no rinse between the first and second aqueous solution is applied.

The second aqueous solution according to the second embodiment of the present invention may further comprises a phosphonate compound.

The method according to the second embodiment comprises, in this order, the steps of
 i. providing a substrate comprising a copper or copper alloy surface,
 ii. contacting said substrate with a first aqueous solution comprising a source of palladium ions and at least one phosphonate compound,
 iii. contacting said substrate with a second aqueous solution comprising at least one source of halide ions and
 iv. depositing a metal or metal alloy layer onto the activated copper or copper alloy surface obtained in step ii. by electroless (autocatalytic) plating
wherein no organic acid or salt thereof comprising a carboxylic group and without phosphonate group is used in the first aqueous solution applied in step ii.

Preferably, the second aqueous solution applied in step iii. is free of added palladium ions. "Added" means that a source of palladium ions is provided and does not take into account palladium ions which may be dragged into the second aqueous solution from the first aqueous solution by transferring the substrate from the first aqueous solution to the second aqueous solution.

The halide ions in the second aqueous solution of the second embodiment of the present invention are preferably selected from the group consisting of chloride, bromide and iodide. Most preferably, the halide ions in the aqueous solution of the first embodiment are chloride ions. The source for halide ions is preferably selected from the corresponding acid or alkaline metal or ammonium salt such as HCl, NaCl, KCl and $NH_4Cl$.

The concentration of halide ions in the second aqueous solution of the second embodiment strongly depends on the operating temperature of the second aqueous solution. At 20° C., the concentration of halide ions preferably ranges from 1 to 50 g/l, more preferably from 2 to 20 g/l, most preferably from 5 to 15 g/l. If the second aqueous solution is heated to 30° C. during use, the concentration of halide ions has to be lowered to preferably 1 to 1000 mg/l, more preferably from 2 to 300 mg/l, most preferably from 10 to 150 mg/l. A working concentration range for halide ions required in the second aqueous solution in a temperature range between 20 and 30° C. can be obtained by routine experiments.

If the halide ion concentration in the second aqueous solution of the second embodiment of the present invention is too high for the respective operation temperature of the bath, it has been found that the activation is weak and that the activation step may fail to start the subsequent autocatalytic reaction.

The pH value of the second aqueous solution in the second embodiment of the present invention can be chosen in a wide range, if the temperature and treatment time are properly adjusted to the chosen pH value. Preferably the pH ranges from 1.0 to 7.0, more preferably from 1.5 to 5.0.

The source of palladium ions for both embodiments of the present invention is selected from water soluble palladium salts such as palladium sulfate. The concentration of palladium ions in the respective aqueous solution of both embodiments preferably ranges from 0.01 to 1 g/l, more preferably from 0.05 to 0.3 g/l.

Phosphonate compounds in accordance with the present invention are organic compounds containing —C—PO$(OH)_2$ and/or —C—PO$(OR_2)$ groups.

The at least one phosphonate compound for both embodiments of the present invention is preferably selected from the group comprising 1-hydroxyethane-1,1,-diphosphonic acid, hydroxyethyl-amino-di(methylene phosphonic acid), carboxymethyl-amino-di(methylene phosphonic-acid), amino-tris(methylene phosphonic-acid), ethylendiamine-tetra(methylene phosphonic acid), hexame-thylendiamino tetra(methylene phosphonic acid), diethylen-triamine-penta (methylene phosphonic acid) and 2-phosphonobutane-1,2,4-tricarboxylic acid.

The concentration of the at least one phosphonate compound for both embodiments of the present invention preferably ranges from 0.3 to 20 mmol/l, more preferably from 1.5 to 8 mmol/l.

The pH value of the aqueous solution comprising palladium ions for both embodiments of the present invention preferably ranges from 0.5 to 4.0, more preferably from 1.0 to 2.0.

Further optional components in the aqueous solutions used in both embodiments of the present invention are for example surfactants, an acid or a base to adjust the aqueous solutions to the desired pH value, buffering agents and complexing agents for palladium ions. Suitable complexing agents for palladium ions are nitrogenated organic compounds such as hydroxyethylamine.

The aqueous solutions comprising palladium ions according to the first and second embodiment of the present invention are preferably held at a temperature in the range between 20 to 60° C., more preferably between 30 to 45° C. when contacting the substrate comprising a copper or copper alloy surface with said aqueous solutions.

The substrate comprising a copper or copper alloy surface is preferably contacted with the aqueous solutions comprising palladium ions according to the first and second embodiment of the present invention for 20 to 180 s, more preferably for 45 to 90 s.

The aqueous solution applied in step iii. of the second embodiment of the present invention is preferably held at a temperature in the range of between between 15 to 50° C., more preferably between 18 to 38° C. when contacting the substrate comprising a copper or copper alloy surface with said aqueous solutions. The corresponding contact time in the second embodiment of the present invention preferably ranges from 20 to 180 s, more preferably from 45 to 90 s.

The substrate comprising a copper or copper alloy surface can be contacted with the aqueous solution(s) applied in the first and second embodiment of the present invention for example by dipping the substrate into the aqueous solution(s) or by spraying the aqueous solution(s) onto the substrate.

The copper or copper alloy surface is then activated with a palladium seed layer which serves as a plating base for successive electroless (autocatalytic) plating of a metal or metal alloy layer thereon.

Preferably, the substrate comprising an activated copper or copper alloy surface is rinsed with water prior to the deposition of a metal or metal alloy layer by electroless (autocatalytic) plating.

The metal or metal alloy layer deposited by electroless (autocatalytic) plating onto the activated copper or copper alloy surface is selected from the group comprising palladium, palladium alloys, nickel alloys and cobalt alloys.

Suitable electroless (autocatalytic) plating bath compositions comprise at least one source of metal ions, a reducing agent, one or more complexing agents and preferably one or more stabilizing agents.

Electroless (autocatalytic) plating bath compositions for depositing a pure palladium layer onto the activated copper or copper alloy surface preferably comprise a source of palladium ions such as palladium chloride, palladium nitrate, palladium acetate, palladium sulfate, a reducing agent selected from formic acid, a derivative or salt thereof and a nitrogenated complexing agent such as ethylene-diamine, 1,3-diamino-propane, 1,2-bis (3-amino-propyl-amino)-ethane, 2-diethyl-amino-ethyl-amine, diethylene-tri-amine, diethylene-triamine-penta-acetic acid, nitro-acetic acid, N-(2-hydroxy-ethyl)-ethylene-diamine, ethylene-di-amine-N,N-diacetic acid, 2-(dimethyl-amino)-ethyl-amine, 1,2-diamino-propyl-amine, 1,3-diamino-propyl-amine, 3-(methyl-amino)-propyl-amine, 3-(dimethyl-amino)-propyl-amine, 3-(diethyl-amino)-propyl-amine, bis-(3-amino-propyl)-amine, 1,2-bis-(3-amino-propyl)-alkyl-amine, diethylene-triamine, triethylene-tetramine, tetra-ethylene-pentamine, penta-ethylene-hexamine and mixtures thereof. Such electroless plating bath compositions for depositing a palladium layer and suitable plating conditions are disclosed in EP 0 698 130 B1 and EP 11184919.6.

Suitable electroless (autocatalytic) plating bath compositions for depositing a Pd—P alloy layer onto the activated copper or copper alloy surface comprise hypophosphite ions as the reducing agent.

Suitable electroless (autocatalytic) plating bath compositions for depositing a Pd—B alloy layer onto the activated copper or copper alloy surface comprise a borane compound as the reducing agent.

Suitable plating bath compositions for depositing a Ni—P alloy layer comprise a source of nickel ions, hypophosphite ions as the reducing agent, complexing agents such as hydroxyl-carboxylic acids or salts thereof and at least one stabilizing agent such as lead ions, antimony ions and sulphur-containing organic stabilizing agents. Suitable electroless (autocatalytic) plating conditions for depositing a Ni—P alloy are known in the art.

Suitable electroless (autocatalytic) plating bath compositions for depositing a Ni—B alloy layer comprise a borane compound as the reducing agent.

Suitable electroless (autocatalytic) plating bath compositions for depositing a ternary nickel alloy Ni—M—P or Ni—M—B wherein M is a metal such as molybdenum or tungsten comprise in addition a source for M ions.

Suitable electroless (autocatalytic) plating bath compositions for depositing a ternary cobalt alloy Co—M—P or Co—M—B wherein M is a metal such as molybdenum or tungsten preferably comprise a source of cobalt ions, a source of M ions, a reducing agent such as hypophosphite ions (phosphorous containing alloys) or a borane compound (boron containing alloys), at least one complexing agent such as hydroxyl carboxylic acids or salts thereof and at least one stabilizing agent. Suitable electrolytic (autocatalytic) plating bath compositions for depositing a ternary cobalt alloy layer are for example disclosed in EP 12159365.1.

The formation of undesired voids in the copper or copper alloy layer is suppressed in both embodiments of the present invention. Furthermore, no undesired skip plating or extraneous plating during electroless (autocatalytic) plating of a metal or metal alloy layer onto the activated copper or copper alloy surface is observed. The metal or metal alloy layer deposited onto the substrate comprising an activated copper or copper alloy surface also has a sufficient adhesion thereon.

The invention will now be illustrated by reference to the following non-limiting examples.

EXAMPLES

Printed circuit board substrates comprising a copper surface were used throughout all examples. The substrates were first cleaned with an aqueous solution comprising sulfuric acid and hydrogen peroxide. Next, the copper surface was activated by different methods, rinsed with water and a palladium layer was deposited onto the activated copper surface by electroless (autocatalytic) plating from an aqueous plating bath composition comprising a source of palladium ions, sodium formate as the reducing agent and a nitrogenated complexing agent.

The presence of undesired voids was investigated after deposition of the palladium layer with an optical microscope and cross-sectioned samples of the plated substrate.

Example 1 (Comparative)

The copper surface of the substrate was activated after cleaning with an aqueous solution containing 100 ppm palladium ions and sulfuric acid. Next, the substrate was rinsed with water and a palladium layer having a thickness of approx. 100 nm was deposited onto the activated copper surface by electroless (autocatalytic) plating.

Undesired voids are present in the interface of the copper surface and the palladium layer deposited by electroless (autocatalytic) plating. The sample it was also subjected to a tape test during which the deposited palladium layer peeled off the underlying copper. Hence, the adhesion between the copper surface and the palladium layer deposited by electroless (autocatalytic) plating thereon is not sufficient.

Example 2 (Comparative)

The copper surface of the substrate was activated after cleaning with an aqueous solution of 100 ppm palladium ions and 1 g/l citric acid, having a pH value of 1.5. Such an activator solution is disclosed in U.S. Pat. No. 7,285,492 B2. The activator solution was held at 35° C. during activation and the substrate was dipped for 1 min into the activator solution. Next, the activated substrate was rinsed with water and a palladium layer having a thickness of approx. 100 nm was deposited onto the activated copper surface by electroless (autocatalytic) plating.

The sample it was subjected to a tape test during which the deposited palladium layer peeled off the underlying copper. Hence, the adhesion between the copper surface and the palladium layer deposited by electroless (autocatalytic) plating thereon is not sufficient.

Example 3

The copper surface of the substrate was activated after cleaning according to the first embodiment of the present invention with an aqueous solution of 100 ppm palladium ions, 1 g/l aminotrimethylphosphonate and 15 ppm chloride ions having a pH value of 1.5. The activator solution was held at 35° C. during activation and the substrate was dipped for 1 min into the activator solution.

Next, the activated substrate was rinsed with water and a palladium layer having a thickness of approx. 100 nm was deposited onto the activated copper surface by electroless (autocatalytic) plating.

The sample it was subjected to a tape test during which good adherence of palladium layer on the underlying copper was found. No voids were detected in the interface of the copper surface and the palladium layer deposited by electroless (autocatalytic) plating.

Example 4

The copper surface of the substrate was activated after cleaning according to the second embodiment of the present invention by dipping the substrate into a first aqueous solution of 100 ppm palladium ions and 1 g/l aminotrimethylphosphonate for 1 min. This aqueous solution did not contain halide ions. The pH value of the first aqueous solution was 1.5 and the temperature 35° C. Next, the substrate was dipped into a second aqueous solution of 1 g/l aminotrimethylphosphonate and 10 g/l chloride ions for 1 min. The pH of the second aqueous solution was 4.5 and the temperature 20° C. Next, the activated substrate was rinsed with water and a palladium layer having a thickness of approx. 100 nm was deposited onto the activated copper surface by electroless (autocatalytic) plating.

The sample was subjected to a tape test during which good adherence of palladium layer on the underlying copper was found. No voids were detected in the interface of the copper surface and the palladium layer deposited by electroless (autocatalytic) plating.

The invention claimed is:

1. A method for activating a copper or copper alloy surface for depositing a metal or metal alloy layer by electroless (autocatalytic) plating thereon comprising, in this order, the steps of
   i. providing a substrate comprising a copper or copper alloy surface,
   ii. contacting said substrate directly with the following components
      a. an aqueous solution containing a source of palladium ions,
      b. an aqueous solution containing a phosphonate compound
      c. an aqueous solution containing a source of halide ions and
   iii. depositing a metal or metal alloy layer onto the activated copper or copper alloy surface obtained in step ii. by electroless plating wherein no organic acid or salt thereof comprising a carboxylic group without phosphonate group is used in step ii.

2. The method for activating a copper or copper alloy surface for depositing a metal or metal alloy layer thereon according to claim 1 wherein the substrate is contacted in step ii. with one aqueous solution comprising a source of palladium ions palladium ions, at least one phosphonate compound and halide ions.

3. The method for activating a copper or copper alloy surface for depositing a metal or metal alloy layer thereon according to claim 2 wherein the concentration of palladium ions ranges from 0.01 to 1 g/l.

4. The method for activating a copper or copper alloy surface for depositing a metal or metal alloy layer thereon according to claim 2 wherein the concentration of the at least one phosphonate compound ranges from 0.3 to 20 mmol/l.

5. The method for activating a copper or copper alloy surface for depositing a metal or metal alloy layer thereon according to claim 2 wherein the concentration of halide ions ranges from 0.1 to 100 mg/l.

6. The method for activating a copper or copper alloy surface for depositing a metal or metal alloy layer thereon according to claim 2 wherein the halide ions are chloride ions.

7. The method for activating a copper or copper alloy surface for depositing a metal or metal alloy layer thereon according to claim 1 wherein the substrate is contacted in step ii. with a first aqueous solution comprising a source of palladium ions and at least one phosphonate compound which is free of halide ions and thereafter with a second aqueous solution comprising halide ions.

8. The method for activating a copper or copper alloy surface for depositing a metal or metal alloy layer thereon according to claim 7 wherein the concentration of palladium ions in the first aqueous solution ranges from 0.01 to 1 g/l.

9. The method for activating a copper or copper alloy surface for depositing a metal or metal alloy layer thereon according to claim 7 wherein the concentration of the at least one phosphonate in the first aqueous solution ranges from 0.3 to 20 mmol/l.

10. The method for activating a copper or copper alloy surface for depositing a metal or metal alloy layer thereon according to claim 7 wherein the halide ions in the second aqueous solution are chloride ions.

11. The method for activating a copper or copper alloy surface for depositing a metal or metal alloy layer thereon according to claim 1 wherein the source of palladium ions is a water soluble palladium salt.

12. The method for activating a copper or copper alloy surface for depositing a metal or metal alloy layer thereon according to claim 1 wherein the at least one phosphonate compound is selected from the group comprising 1-hydroxyethane-1,1,-diphosphonic acid, hydroxyethyl-amino-di(methylene phosphonic acid), carboxymethyl-amino-di (methylene-phosphonic-acid), amino-tris(methylene phosphonic-acid), ethylendiamine-tetra(methylene phosphonic acid), hexamethylendiamino-tetra(methylene phosphonic acid), diethylen-triamine-penta (methylene phosphonic acid) and 2-phosphonobutane-1,2,4-tricarboxylic acid.

13. The method for activating a copper or copper alloy surface for depositing a metal or metal alloy layer thereon according to claim 1 wherein the metal or metal alloy deposited in step iii. is selected from the group comprising palladium, palladium alloys, nickel alloys and cobalt alloys.

14. The method for activating a copper or copper alloy surface for depositing a metal or metal alloy layer thereon according to claim 3 wherein the concentration of the at least one phosphonate compound ranges from 0.3to 20 mmol/l.

15. The method for activating a copper or copper alloy surface for depositing a metal or metal alloy layer thereon according to claim 3 wherein the concentration of halide ions ranges from 0.1 to 100 mg/l.

16. The method for activating a copper or copper alloy surface for depositing a metal or metal alloy layer thereon according to claim 4 wherein the concentration of halide ions ranges from 0.1 to 100 mg/l.

17. The method for activating a copper or copper alloy surface for depositing a metal or metal alloy layer thereon according to claim 8 wherein the concentration of the at least one phosphonate in the first aqueous solution ranges from 0.3 to 20 mmol/l.

18. The method for activating a copper or copper alloy surface for depositing a metal or metal alloy layer thereon according to claim 7 wherein the source of palladium ions is a water soluble palladium salt.

19. The method for activating a copper or copper alloy surface for depositing a metal or metal alloy layer thereon according to claim 7 wherein the at least one phosphonate compound is selected from the group comprising 1-hydroxy-ethane-1,1,-diphosphonic acid, hydroxyethyl-amino-di(methylene phosphonic acid), carboxymethyl-amino-di(methylene-phosphonic-acid), amino-tris(methylene phosphonic-acid), ethylendiamine-tetra (methylene phosphonic acid), hexamethylendiamino-tetra(methylene phosphonic acid), diethylen-triamine-penta(methylene phosphonic acid) and 2-phosphonobutane-1,2,4-tricarboxylic acid.

20. The method for activating a copper or copper alloy surface for depositing a metal or metal alloy layer thereon according to claim 7 wherein the metal or metal alloy deposited in step iii. is selected from the group comprising palladium, palladium alloys, nickel alloys and cobalt alloys.

\* \* \* \* \*